United States Patent [19]
Goof
[11] 4,225,803
[45] Sep. 30, 1980

[54] APPARATUS FOR REMOVING MATERIAL COATINGS FROM INTERIOR SURFACES OF CONTAINERS

[76] Inventor: Sven K. L. Goof, Gammel Strandvej 236 B, Humlebaek, Denmark, DK-3050

[21] Appl. No.: 900,707

[22] Filed: Apr. 27, 1978

Related U.S. Application Data

[63] Continuation of Ser. No. 701,997, Jul. 1, 1976, abandoned.

[30] Foreign Application Priority Data

Jul. 4, 1975 [DK] Denmark .......................... 3029/75

[51] Int. Cl.[2] .......................................... H01L 41/10

[52] U.S. Cl. .................................. 310/323; 310/325; 310/334; 310/337; 310/328; 310/26

[58] Field of Search ............... 310/322, 323, 324, 328, 310/334, 337, 26; 340/9, 10; 259/1 R, DIG. 41, DIG. 42, DIG. 44; 134/1, 184; 68/35 S; 34/9, 10

[56] References Cited

U.S. PATENT DOCUMENTS

| | | | |
|---|---|---|---|
| 1,495,429 | 5/1924 | Nicolson | 310/334 X |
| 2,190,666 | 2/1940 | Kallmeyer | 310/26 X |
| 2,466,112 | 4/1949 | Keller | 310/334 X |
| 2,853,692 | 9/1958 | Wallace | 310/26 X |
| 2,970,660 | 2/1961 | Bodine, Jr. | 310/26 X |
| 3,139,543 | 6/1964 | Balamuth et al. | 310/26 |
| 3,160,769 | 12/1964 | Abbott | 310/26 |
| 3,258,738 | 6/1966 | Merchant | 340/9 |
| 3,277,433 | 10/1966 | Toulis | 310/337 X |
| 3,731,267 | 5/1973 | Brandt et al. | 310/322 X |
| 4,100,527 | 7/1978 | Tocquet | 340/9 X |

*Primary Examiner*—Mark O. Budd
*Attorney, Agent, or Firm*—Parmelee, Johnson, Bollinger & Bramblett

[57] ABSTRACT

The invention concerns an improved apparatus for removing interior material coatings in various containers such as sanitary bowls. The apparatus may be partially or completely immersed or introduced into liquid in a container to be cleaned and due to an improved arrangement of high frequency vibrator elements in the interior of an immersed apparatus housing, a particularly efficient and uniform power emission may be achieved from the oscillating housing walls, said power providing cavitations at the container walls to be cleaned whereby coatings may be loosened in an effective manner without damaging the container walls.

11 Claims, 4 Drawing Figures

APPARATUS FOR REMOVING MATERIAL COATINGS FROM INTERIOR SURFACES OF CONTAINERS

This is a continuation of application Ser. No. 701,997 filed July 1, 1976, now abandoned.

The present invention relates to an apparatus for removing material coatings from inner surfaces of containers.

In connection with various liquid containers, undesired coatings often occur on the inner surfaces. An example is calcium coatings in various sanitary installations, such as lavatory bowls wherein iron compounds in the coating furthermore cause an unaesthetic colouring of the coating.

Such coatings have been removed by beating them loose or by dissolving the coating with acid which are very time-consuming and difficult procedures and which, at the same time, may result in damages to the container wall itself or to other components in the interior of the container.

Thus, there is a great need for improved means by which coatings may be effectively and quickly removed in a manner gentle to the container itself.

Attempts have been made to develop so-called sonic or ultrasonic cleaning tools by which energy is introduced into a liquid in a receptacle or container to be cleaned by means of an oscillating wall which is immersed or introduced into the liquid so as to cause cavitation whereby to effect a highly effective and intensive scrubbing of the inside surface of the container. However, such prior art apparatuses have not been particularly successful due to low efficiency and, in particular, due to the fact that the energy or power emission is directional so that it is necessary e.g. to rotate or otherwise reorient the apparatus during its operation in order to achieve an effective cleaning of all interior container surfaces. The low or unsatisfactory efficiency of prior art apparatuses is caused either by heavy cavitations occurring at the interface between the oscillating apparatus wall and the surrounding liquid or due to an inefficient transfer of mechanical oscillations to the immersed wall.

On the above background it is an object of this invention to provide an improved apparatus for cleaning inside surface of various types of containers, the apparatus being of the type having a housing adapted for immersion in an liquid in the container, said housing having at least one vibrator element adapted to put the walls of the housing into high frequency oscillations.

The improvement provided by the invention comprises the fact that at least certain of the vibrator elements are constructed as substantially bar-like elements extending through the interior of the housing connected to opposite parts of the inside wall of the housing.

By this arrangement, the transfer of mechanical osciallations between the bar-like elements and the housing wall is highly efficient. Moreover, by appropriately adjusting and disposing the elements depending on the shape of the housing, the power emission per unit of area from the outer surface of the housing may be made relatively uniform, whereby the apparatus may operate at a maximum power emission over considerable portions of the housing without causing considerable cavitations to occur, not even locally, at the interface between the liquid and the housing, whereby the efficiency of the apparatus of the invention is further improved.

The housing of the apparatus according to the invention may have various forms or shapes depending on the container to be cleaned. However, in a preferred embodiment the housing is a cylindrical shell having at least one end being sealed and adapted for immersion. In that embodiment the bar-like vibrator elements or transducer units are arranged substantially diametrically in the housing and angularly offset relative to each other.

Tests performed with this preferred embodiment have shown that the power emission was nearly omnidirectional in planes at right angles to the axis of the housing and along almost the entire axial extension of the housing. Accordingly, it was not necessary to rotate or otherwise move the apparatus relative to the container surface being cleaned and yet the tests showed that even a heavily coated lavatory bowl could be cleaned completely within a few minutes.

Another embodiment of the apparatus has an immersible housing which is a spherical shell wherein the bar-like vibrator elements are arranged extending through the center point of the shell, thus providing an apparatus being suited for use in containers of various shapes and configurations.

According to the invention, the bar-like vibrator elements may include several vibrator units acting along the same axis of oscillation whereby the possibility of generating a desired amount of power is improved.

Moreover, in the apparatus according to the invention, the bar-like vibrator elements may be supplemented by other vibrator elements connected with the inner wall of the housing. Thereby, specific areas of the housing such as the immersed end wall in the above mentioned preferred embodiment may be provided with such additional elements, thus improving the possibility of achieving a desired uniform power emission.

Finally, according to a further aspect of the invention, the respective ends of the vibrator elements may advantageously be connected with the inner wall of the housing through separate and interjacent adaptors being rigidly secured between the respective vibrator element and the inner wall.

Further objects and advantages of this invention will appear durin the following description when taken in conjunction with the accompanying drawings in which.

The main components of the apparatus according to the invention are a housing or encapsulation in the interior of which vibrator elements are mounted.

The encapsulation may have several different shapes, however shapes having a substantially circular cross section are preferred since a substantially uniform energy emission may be achieved thereby during the use of the apparatus, e.g. in all directions in planes perpendicular to a vertical axis. However, a similar effect may also be obtained with other encapsulation shapes or designs such as various polygonal cross-sections. Moreover, it may be expedient to shape the encapsulation depending on the shape of the liquid containers to be cleaned, in particular if these have a special shape.

The encapsulation is adapted for full or partial immersion into a liquid, and for this purpose the encapsulation may be provided with a handle or stick as required. Finally, the encapsulation must include a cable or wire entry which may be made liquid-tight, in particular in encapsulations adapted for complete immersion. The wire entry may be combined with a stick or handle on the encapsulation as indicated in FIG. 1.

In a preferred embodiment, the encapsulation has the shape of a cylindrical shell, the end surfaces of which may be plane or arched. In another embodiment, the encapsulation has the shape of a spherical shell which may be composed of two liquid tightly joined halves.

As vibrator elements it is possible to use substantially any construction which may, on the one hand, be built into the interior of the encapsulation and, on the one hand, may generate the frequencies and powers needed. A preferred vibrator element is the piezo-electric type of element, the main component of which being a quartz crystal or another piezoelectric material such as barium titanate or lead zirconium-titanate. This material is inserted or biased between different layers of material comprising the electric connections required. Such vibrator elements are particularly well suited in connection with the apparatus of the invention as they may be made as small units to be directly affixed to the inner wall of the encapsulation e.g. by glueing.

Figure 1:
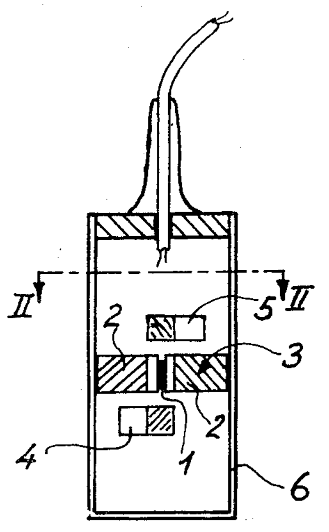
FIG. 1 is a schematic cross-sectional view of an embodiment of the apparatus according to the invention.
Figure 2:
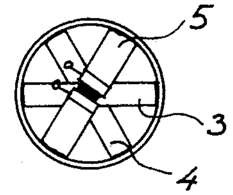
FIG. 2 is a sectional view taken along line II—II in FIG. 1.

FIGS. 1 and 2 illustrate a preferred embodiment of the cleaning tool according to the invention. A number of piezoelectric vibrator elements are shown schematically, having a piezoelectric material 1 inserted or biased between two end blocks 2 forming the two oscillating components of the elements. Such a substantially bar-like vibrator element 3 is inserted and affixed, extending diametrically through the interior of the encapsulation. The end portions of the elements are shaped according to the outline of the inner wall and are affixed to the inner wall along the entire surface of contact, e.g. by glueing.

Further vibrator elements, such as the elements 4 and 5, may also be inserted in a similar way, and if so it is advantageous that the elements are mutually offset a certain angle as illustrated in FIG. 2. Each diametrically extending vibrator element may, in addition, be composed of a number of vibrator elements operating along the same axis of oscillation and, besides, appropriate filler pieces m be inserted where required.

By this construction an effective transmission of the oscillations of the vibrator element to the wall 6 of the encapsulation is achieved and, furthermore, a fairly uniform transmission of power into a liquid on the outer side of the encapsulation in directions perpendicular to the central axis of the encapsulation is achieved.

Figure 3:
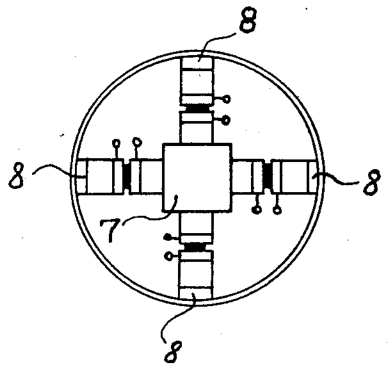
FIG. 3 is a schematic view illustrating an alternative arrangement of the vibrator elements in the apparatus according to the invention.

FIG. 3 illustrates an alternative possibility of mounting the vibrator elements in the interior of the encapsulation. A number of vibrator elements are positioned in the same plane and on one side they are connected to the inner wall of the encapsulation, and on the other side to a centre piece 7, the shape of which depends on the number of vibrator elements used. In order to obtain the same effective transmission of oscillations from vibrator to encapsulation as in the embodiment according to FIGS. 1 and 2, the vibrator elements are arranged in pairs of aligned elements working along the same axis of oscillation. By this construction it is thus possible to mount several vibrator elements working in the same plane, and in an elongated encapsulation a number of such vibrator elements may be mounted at different levels along the axis of the encapsulation.

This arrangement is, however, also well suited for use in connection with spherically shaped encapsulations. In FIG. 3, the centre piece 7 might, thus, be cubical and an additional pair of vibrator elements might then be provided perpendicularly to the plane of the drawing, whereby a configuration to be encircled by a sperical shell is obtained. The number of pairs of vibrator elements may of course vary, which would only require a suitable configuration of the centre part.

Figure 4:
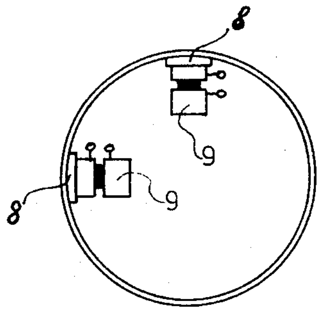
FIG. 4 is a schematic view illustrating additional vibrator elements for supplementing the bar-like elements.

FIG. 4 illustrates additional vibrator elements 9 which are mounted free-hanging only one end secured to the inner wall of the encapsulation shown in cross section and which may be of cylindrical or spherical shape. Such additional elements 9 may be used in connection with substantially any shape of the encapsulation or housing to supplement the bar-like elements. Thus, one or more additional elements 9 could e.g. be mounted on the bottom wall of the encapsulation 6 illustrated in FIG. 1.

In all the embodiments described so far, the vibrator elements may be secured to the inner wall of the encapsulation by means of separate adaptors or connecting pieces 8. In this manner, commercially available vibrator elements may be used, without it being necessary to work up their normally plane end surfaces in order to obtain an adaptation of the shape to the inner wall of the encapsulation. Thus, the necessary adaptation as to shape may be performed on the connecting pieces which may then be e.g. glued to the plane end surfaces of the vibrator elements.

The apparatus according to the invention includes of course connection wires (not shown) for supply of electric power to the respective vibrator elements. Besides, equipment for control of different parameters, such as the frequency, may be provided.

As already mentioned, any practically usable type of high frequent vibrator element may be used in the tool according to the invention. An essential feature appears to be, however, that the elements used are connected to the inner wall of the encapsulation in the manner stated above, i.e. by adaptation of the shape of the element to the outline of the inner wall and by affixation, e.g. by glueing, along the entire surface of contact, to the inner wall of the encapsulation. Such a connection or attachment may advantageously be performed by means of separate connecting pieces corresponding to the connection pieces 8 mentioned above, also in connection with the additional or supplementary elements 9.

While the cleaning tool according to the invention is primarily intended for cleaning sanitary bowls and the like, the same principle may of course be used in connection with cleaning of various other liquid containers, such as heat exchanger containers, in which it is possible to immerse or introduce the tool in the liquid in the interior of the liquid container. In particular in connection with the cleaning of such other containers, possibly having a somewhat special shape or comprising additional components, such as heat exchanger tubes, it may be required that the apparatus according to the invention is shaped in a more special way in order to obtain the possibility of introducing the tool and to obtain an effective and uniform emission of power through the liquid in the container to the various coated surfaces in the interior of the container.

Besides, the number of vibrator elements and their distribution and arrangement in the interior of the encapsulation may differ according to the cleaning operations for which the apparatus is particularly intended.

While there have been described and illustrated certain preferred embodiments of the present invention and certain further modifications thereof have been indicated, it will be apparent to those skilled in the art that still further modifications may be made without deviating from the broad principle and intent of this invention, which shall be limited only by the scope of the appended claims.

Thus, in place of or in addition to the handle or stick, the apparatus may include an outwardly extending and appropriately shaped flange at the upper portion of the encapsulation. Such a flange could e.g. be adapted to hold the apparatus in a proper position on the upper rim of a lavatory bowl.

Moreover, the apparatus may comprise appropriate terminal means for connecting an electrical supply cord, or the apparatus may be permanently connected with a supply cable leading to a suitable high-frequency generator.

What is claimed is:

1. An apparatus for removing deposits of material coatings from the inner surfaces of containers, such as lavatory bowls, heat exchanger containers, heat exchanger tubes, and the like, said cleaning apparatus comprising an elongate housing having a longitudinal axis with handle means on one end and being adapted to be immersed at least partially in a liquid within a container to be cleaned, a plurality of substantially bar-like, high frequency vibrator elements extending across the interior of said housing from one side to the other side of said housing, said bar-like vibrator elements being positioned at different axial positions along the longitudinal axis of said housing, and said bar-like vibrator elements at the respective axial positions being progressively angularly offset from the bar-like vibrator elements at other axial positions into different angular positions as viewed in the axial direction of said housing, and the opposite end portions of each of said bar-like vibrator elements being shaped to fit the outline of the inner surface of the elongate housing and being affixed thereto along the entire area of contact therebetween, whereby the power emission per unit of area from the outer surface of the housing is relatively uniform in directions perpendicular to the axis of the housing, thereby enabling the deposits of material coatings on the inner surfaces of the container to be effectively removed without rotating the housing of the cleaning apparatus relatively to the wall of the container.

2. An apparatus for removing deposits of material coatings from the inner surfaces of containers, such as lavatory bowls, heat exchanger containers, heat exchanger tubes, and the like, as claimed in claim 1, in which said bar-like vibrator elements are supplemented by additional free-hanging vibrator elements connected to the inner surface of the housing and supported solely by the housing.

3. An apparatus for removing deposits of material coatings from the inner surfaces of containers, such as lavatory bowls, heat exchanger containers, heat exchanger tubes, and the like, as claimed in claim 1, in which: said substantially bar-like vibrator elements are supported within said housing solely by their end portions being affixed to the housing.

4. Apparatus for removing deposits of material coatings from the inner surfaces of containers, such as lavatory bowls, heat exchanger containers, heat exchanger tubes, and the like, as claimed in claim 1, characterized in that each of said bar-like vibrator elements includes a plurality of vibrator units, all of said vibrator units along each bar-like vibrator element acting along the same axis of oscillation.

5. Apparatus for cleaning material coatings and deposits from the inner surfaces of containers as claimed in claim 1, characterized in that said bar-like vibrator elements are supplemented by additional vibrator elements supported by and affixed to the inner surface of the housing.

6. Apparatus for removing deposits of material coatings from the inner surfaces of containers, such as lavatory bowls, heat exchanger containers, heat exchanger tubes, and the like, as claimed in claim 1, characterized in that the respective end portions of said bar-like vibrator elements comprise adapter pieces shaped to conform to the adjacent inside surfaces of the elongate cylindrical housing and being rigidly affixed between the vibrator element and the inside surface of said housing.

7. Apparatus for cleaning material coatings and deposits from the inner surfaces of containers, said cleaning apparatus comprising a spherical housing adapted to be immersed in a liquid within the container to be cleaned, a plurality of bar-like ultrasonic vibrator elements extending diametrically across the interior of said housing, the end portions of each of said bar-like vibrator elements being shaped to fit the outline of the inner surface of the spherical housing and being affixed thereto along the area of contact therebetween, whereby the power emission per unit of area from the outer surface of the spherical housing is relatively uniform in all directions thereby enabling a container to be effectively cleaned without rotating the housing of the cleaning apparatus relative to the wall of the container.

8. Apparatus for cleaning material coatings and deposits from the inner surfaces of containers as claimed in claim 1, in which a cubical centerpiece is positioned at the center of said spherical housing, each of said barlike vibrator elements including a pair of bar-like vibrator units extending radially between opposite sides of the cubical centerpiece and the inner surface of the spherical housing, each said vibrator unit being connected to the centerpiece and to the area of the inner surface of the housing with which it is in contact.

9. Apparatus for removing material coatings from the inner surfaces of containers for cleaning the containers, said apparatus comprising a housing adapted for immersion in a liquid in the container to be cleaned, said housing having a plurality of vibrator elements adapted to put the walls of the housing into high frequency oscillations, said apparatus being characteristized in that at least certain of said vibrator elements are constructed as substantially bar-like elements extending across the interior of the housing into contact with opposite sides of the housing, each of said bar-like vibrator elements having its opposite end portions shaped to conform to the adjacent inside surfaces of the wall of the housing with which they are in contact and being affixed thereto over the area of contact, said housing being spherical, and said bar-like vibrator elements being arranged extending through the center point of said housing.

10. Apparatus for removing material coatings from the inner surfaces of containers as claimed in claim 9, characterized in that the respective end portions of said bar-like vibrator elements comprise adapter pieces shaped to conform to the inside surface of the spherical housing and being rigidly affixed between the vibrator element and the inside surface of said spherical housing.

11. An apparatus for cleaning coating deposits from the inner surfaces of containers, such as sanitary bowls, heat exchanger containers, heat exchanger tubes, and the like, said cleaning apparatus comprising an elongated cylindrical housing with two ends and having a longitudinal axis, at least one of said ends of said housing being closed, said housing having handle means at the other end and being adapted to be immersed at least partially in a liquid within a container to be cleaned, a plurality of substantially bar-like high frequency vibrator elements extending diametrically across the interior of the housing perpendicular to said axis, said vibrator elements being positioned at different axial positions along the longitudinal axis of said housing, the vibrator elements at the respective axial positions being oriented into different angular positions as viewed looking along said axis, with the angular offset between successive vibrator elements being an acute angle, and the opposite end portions of each bar-like vibrator element being shaped to fit the outline of the inner surface of the elongate housing and being affixed thereto over the entire area of contact therebetween, whereby the power emission per unit of area from the outer surface of the housing is relatively uniform in directions perpendicular to the axis of the housing, thereby enabling the coating deposits to be effectively cleaned from the inner surfaces of the container without rotating the housing of the cleaning apparatus relatively to the inside surfaces of the container.

* * * * *